(12) United States Patent
Ganesh

(10) Patent No.: US 8,779,928 B2
(45) Date of Patent: Jul. 15, 2014

(54) SYSTEMS AND METHODS TO DETECT GENERATOR COLLECTOR FLASHOVER

(75) Inventor: Meena Ganesh, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 252 days.

(21) Appl. No.: 13/463,238

(22) Filed: May 3, 2012

(65) Prior Publication Data

US 2013/0293383 A1    Nov. 7, 2013

(51) Int. Cl.
    *G08B 21/00*    (2006.01)
(52) U.S. Cl.
    USPC .................. 340/635; 340/650; 324/765.01
(58) Field of Classification Search
    CPC ............................ G01R 31/021; G01R 31/343
    USPC .......... 340/646, 647, 648, 650, 635; 324/500, 324/537, 551, 765.01; 361/1, 2, 20
    See application file for complete search history.

(56) References Cited

U.S. PATENT DOCUMENTS

| | | |
|---|---|---|
| 5,126,677 A | 6/1992 | Campbell et al. |
| 6,114,871 A | 9/2000 | Shiota et al. |
| 7,579,843 B2 | 8/2009 | Younsi et al. |
| 7,676,333 B2 | 3/2010 | Younsi et al. |
| 7,952,360 B2 | 5/2011 | Ganesh |
| 2011/0238345 A1 | 9/2011 | Gauthier et al. |

OTHER PUBLICATIONS

Stone, Greg C., et al., "In-Service Evaluation of Motor and Generator Stator Windings Using Partial Discharge Tests," IEEE Transactions on Industry Applications, vol. 31, No. 2, Mar./Apr. 1995, pp. 299-303.

Culbert, I.M., et al., "On-Line Measurement of Partial Discharges on Large Motors in a Generating Station," IEEE, 2001, pp. 537-540.

Henriksen, M., et al., "Propagation of Partial Discharge and Noise Pulses in Turbine Generators," IEEE Power Engineering Review, Sep. 1986, p. 41.

*Primary Examiner* — Jeffrey Hofsass
(74) *Attorney, Agent, or Firm* — Ann M. Agosti

(57) ABSTRACT

Systems and methods for generating a collector flashover alert by passive monitoring of a generator are provided. One method includes receiving, by a computing device, signals from a current transformer coupled around an exciter cable connected to a generator collector assembly, determining, by the computing device, when a spark has occurred in the generator collector assembly based at least in part on received signals from the current transformer, generating an indication that a spark has occurred in the generator collector assembly when it is determined that a spark has occurred in the generator collector assembly, and generating a flashover alert based at least in part on the generated indication that a spark has occurred in the generator collector assembly.

20 Claims, 5 Drawing Sheets

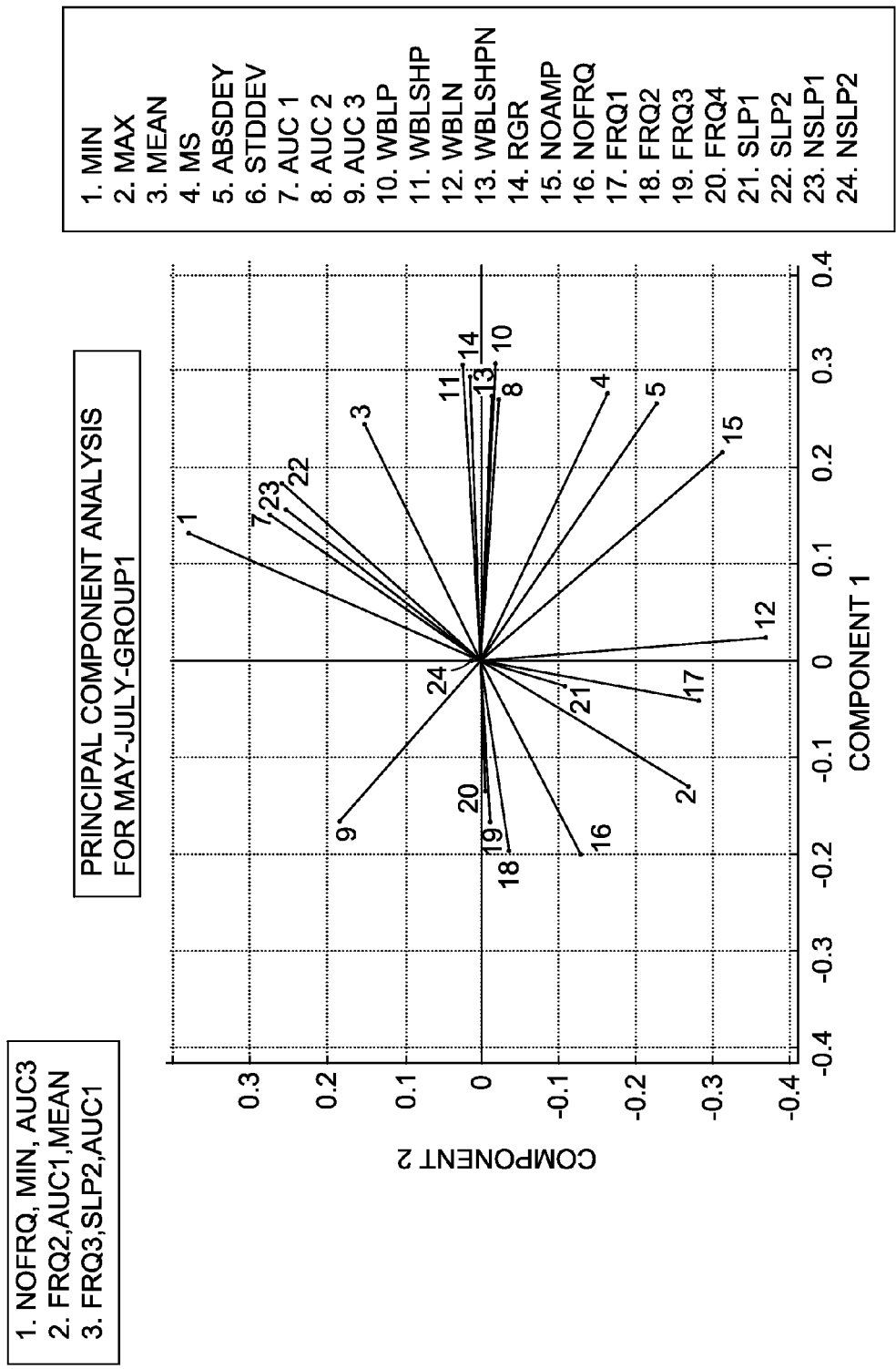

SYSTEMS AND METHODS TO DETECT GENERATOR COLLECTOR FLASHOVER

BACKGROUND OF THE INVENTION

The field of the invention relates generally to monitoring generators and, more particularly, to methods and systems to monitor a generator for sparking and discharge events.

Carbon brushes in a generator collector assembly conduct current from a stationary position to a rotating collector. Some non-destructive sparking at the brushes is common and generally does not produce excessive wear on the brushes or erosion of the collector ring surfaces. Collector flashover, however, is a common cause of a generator outage. Flashover describes the opening of the highly inductive generator field circuit and can occur at positive or negative polarity. Flashover often occurs after carbon brushes have been sparking for a long time.

A common method of preventing collector flashover in a generator collector assembly is to routinely inspect, maintain, and overhaul the generator. There are several measurements and checklists that facilitate such maintenance. Commercially available systems do not, however, provide an in-situ, continuous monitoring system for preventive and planned maintenance.

BRIEF DESCRIPTION OF THE INVENTION

In one embodiment, a system for monitoring a generator collector assembly is provided. The system includes a first current transformer for placement around a first exciter cable connected to a generator, and a computing device coupled to receive signals from the first current transformer. The computing device is programmed to determine when a spark has occurred in the generator collector assembly based at least in part on the received signals from the first current transformer, and generate an indication that a spark has occurred in the generator.

In another embodiment, a method for passive monitoring of a generator collector assembly is provided. The method includes receiving, by a computing device, signals from a current transformer coupled around an exciter cable connected to a generator, determining, by the computing device, when a spark has occurred in the generator collector assembly based at least in part on received signals from the current transformer, and generating an indication that a spark has occurred in the generator when the computing device has determined that a spark has occurred in the generator.

In yet another embodiment, a method of training a system for passive monitoring of a generator collector assembly is provided. The method includes receiving, by a computing device, signals from a first current transformer coupled around an exciter cable connected to a generator collector assembly, storing a plurality of segments of the signals from the first current transformer in response to detecting a plurality of the signals exceeding a predetermined threshold received from the first current transformer, extracting at least one feature of the signals from the plurality of segments of the signals, and generating at least one signal threshold corresponding to a spark in the generator based at least in part on the extracted characteristic of the signals. Each segment of the plurality of segments of the signals is associated with a detected segment of the plurality of segments on the signals received from the first current transformer.

BRIEF DESCRIPTION OF THE DRAWINGS

FIG. 5 is a projection in factor space of twenty four signal features acquired from the exemplary system in FIG. 1.

DETAILED DESCRIPTION OF THE INVENTION

The methods and systems described herein are useful for passively monitoring a generator collector assembly and detecting sparking that may precede collector flashover. Because the system monitors a generator collector assembly passively, active pulsing of brush assembly wires can be avoided. Accordingly, monitoring can be performed on a continuous basis, and without interfering with the operation of the generator.

Figure 1:
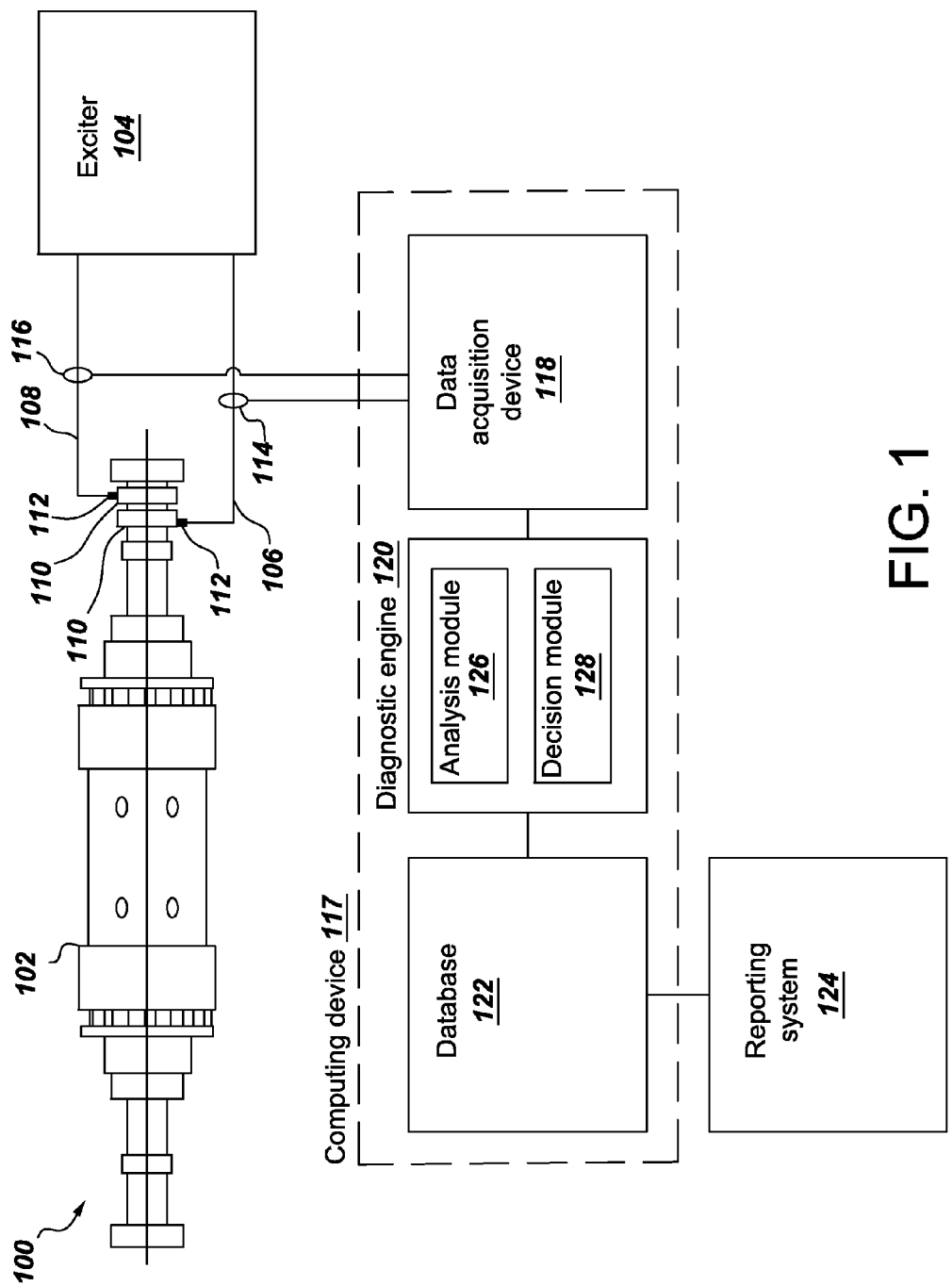
FIG. 1 is an illustration of an exemplary system for passively monitoring a generator collector assembly.

An exemplary system 100 for monitoring a generator 102 is shown in FIG. 1. Generator 102 is electrically coupled to an exciter 104 by a first exciter cable 106 and a second exciter cable 108. Exciter 104 provides a current to field coils (not shown) of generator 102 through a generator collector assembly. The generator collector assembly includes collector rings 110 (sometimes referred to as slip rings), stationary carbon brushes 112, and brush holders (not shown). Stationary carbon brushes 112 couple current from first and second exciter cables 106 and 108 to rotating collector rings 110. Current from exciter 104 passes through a negative brush 112 and ring 110, to the rotor field (not shown) of generator 102, and returns through a positive brush 112 and ring 110.

In the exemplary embodiment, monitoring system 100 includes a first sensor 114 and a second sensor 116. First sensor 114 and second sensor 116 are toroidal sensors coupled around first exciter cable 106 and second exciter cable 108, respectively. First sensor 114 and second sensor 116 sense transients emanating from brushes 112 in real time. In the exemplary embodiment, first sensor 114 and second sensor 116 are current transformers. Varying currents through first and second exciter cables 106 and 108 induce currents in first and second sensors 114 and 116. These induced currents are monitored as signals from first and second sensors 114 and 116. Moreover, in the exemplary embodiment, first and second sensors 114 and 116 are high frequency current transformers, also sometimes referred to as radio frequency current transformers. High frequency current transformers are designed for monitoring signals in the high frequency range and/or in the radio frequency range. In other embodiments, system 100 includes more or fewer sensors. In some embodiments, a single sensor is used to monitor current entering or exiting the rotor field coil of generator 102. Moreover, in other embodiments, sensors 114 and 116 may be any other suitable type of sensor and may be optimized for any suitable frequency of signals.

The output of first and second sensors 114 and 116 is sent to a computing device 117. Computing device 117 includes a data acquisition device (DAQ) 118, a diagnostic engine 120, and a database 122. In the exemplary embodiment, DAQ 118, diagnostic engine 120, and database 122 are components and/or functional modules integrated in a single computing device. In other embodiments, DAQ 118, diagnostic engine 120, and database 122 may be divided among two or more separate computing devices, but may still be referred to as computing device 117.

In the exemplary embodiment, DAQ 118 includes a single board computer and digitizer. In other embodiments, DAQ 118 may include any other suitable computing device. DAQ 118 receives and monitors the signals from sensors 114 and 116 over time. In general, DAQ 118 compares received signals from first and second sensors 114 and 116 to the threshold(s) and/or algorithmic models to determine when a partial discharge event, such as a spark, has occurred in generator 102.

More specifically, the signal data is sent to diagnostics engine 120 for processing and analysis. The diagnostic engine 120 uses diagnostic algorithms and decision models in order to determine whether or not the received data indicates a sparking event has occurred. Moreover, diagnostic engine 120 is be used to train the diagnostic algorithms and/or decision models at the site of generator 102 as described in more detail below. When sparking events are identified, the associated data may be stored in a database 122 or other storage system and used by a reporting system 124 to provide information to an operator, such as maintenance personnel. In the exemplary embodiment, diagnostic engine 120 and database 122 are separate from DAQ 118. In other embodiments diagnostic engine 120 and database 122 are fully or partially incorporated in DAQ 118.

DAQ 118 is configured to monitor the data coming from each sensor 114 and 116, and to respond to certain conditions by saving a group of data and forwarding it on to diagnostics engine 120 when the triggering conditions are met. In one embodiment, the trigger conditions are chosen so that whenever a particular rate of change is observed in a signal, that signal is selected for capture. Alternatively, the trigger relates to the absolute voltage level being above (or below) a specific threshold. In addition to such triggering conditions, DAQ 118 can also be configured to sample the incoming signals at a particular frequency. The combination of operating and triggering conditions for the DAQ 118 is referred to below as the "DAQ parameters". In general, the DAQ parameters are chosen to cause the DAQ to capture and forward data when a signal of interest is detected in the monitored cable 106 or 108. Such signals may be caused by, for example, a spark being created by the wire, partial discharge event, or by noise on the wire. Moreover, in some embodiments, only the first sensor 114 is monitored to detect a signal on first exciter cable 106. When a signal is detected on exciter cable 106, data from both sensors 114 and 116 is saved and forwarded to diagnostic engine 120.

When DAQ 118 detects a signal from one of its sensors 114 or 116 that meets the triggering conditions, DAQ 118 captures a number of sequential data readings for that sensor 114 or 116. In some embodiments, DAQ 118 also captures a number of data readings for the other (non-triggering) sensor 116 or 114. These data readings from the sensor 114 and/or 116 are forwarded along with an appropriate time stamp to diagnostics engine 120 for analysis.

The signal data from each sensor 114 and 116 is sent from DAQ 118 to diagnostics engine 120. In addition to the captured data, diagnostics engine 120 also retrieves the DAQ parameters that characterize the operating rules of DAQ 118. The DAQ parameters may be stored in DAQ 118 and forwarded on to diagnostics engine 120 as appropriate, or may be made available to diagnostics engine 120 via a lookup table or other storage that may be associated with diagnostics engine 120. Exemplary DAQ parameters may include the trigger level (for example, 200 millivolts) used for the DAQ 118, and the sampling frequency at which DAQ 118 is recording data from each sensor.

Diagnostics engine 120 includes two modules that are used to evaluate the incoming data: an analysis module 126 that is used to determine a set of signal features associated with the incoming signal data; and a decision module 128 that uses the signal features and other information, such as the DAQ parameters, to make a decision (sometimes referred to herein as a defect decision) as to whether or not a sparking event has occurred and/or whether or not a collector flashover is likely to occur in the future. This defect decision can include a measure of the confidence associated with the decision.

Figure 2:
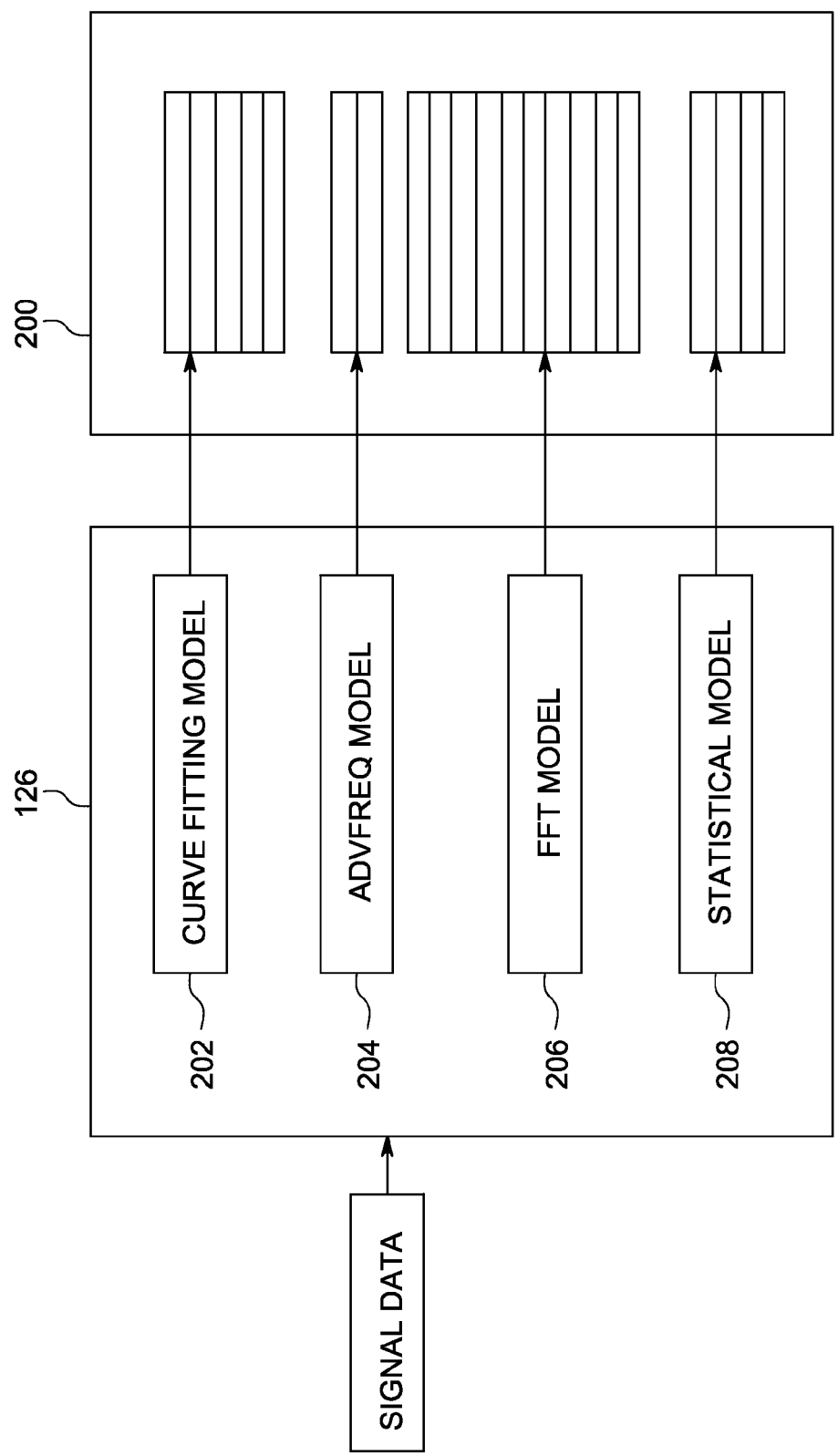
FIG. 2 is a functional diagram of an analysis module for use in the system in FIG. 1.

FIG. 2 illustrates the various models employed by analysis module 126 to generate desired signal features 200. These models include a curve fitting model 202, an ADVFREQ model 204, a fast-Fourier transform (FFT) model 206, and a statistical model 208. Each of these models comprises a set of executable code that is used to analyze the incoming data, e.g. the signal data, and execution of the model in diagnostic engine 120 produces one or more of signal features 200 that analysis module 126 determines for the signal. Each model, and its output signals, will be discussed in greater detail below. In other embodiments more or fewer models, including different models, may be employed.

Curve fitting model 202 is used to fit the incoming signal data to a Weibull envelope. This analysis generates estimates of the scale and shape parameters of the positive and negative portions of the signal data that can be used to characterize a Weibull distribution for the signal data. The shape and scale parameters are those parameters that produce a model that fits the signal data received. Such techniques are known in the art as a way of approximating a probability distribution function that corresponds to the data received. Furthermore, in some embodiments, curve fitting model 202 calculates and outputs as signal features 200 the slope for the rise and fall time of the signal (for both the positive and negative parts of the signal), the inflection point of the signal with respect to maximum amplitude, and the point at which the maximum amplitude of the signal occurs.

ADVFREQ model 204 is used to generate data that can be used by decision module 128 to differentiate between data signals representing sparking events and simply noise in the signal. An amplitude spectrum estimate is calculated for the signal data, and the DC amplitude of the signal is subtracted from the signal data. The main frequency, amplitude, and phase are calculated for the non-DC signal as is known in the art. Techniques such as using the amplitude spectrum of the autocorrelation function can be used to improve the frequency estimate of the signal data. The main frequency and its amplitude are output as signal features 200 of the analyzed signal data. The amplitude from this model and the Weibull scale is used as one of the derived features in the models FFT model 206 is used to perform a discrete Fourier transform on the signal data to determine the component frequencies of the signal. The Fourier transform may be calculated using the signal data and the sampling frequency (one of the DAQ parameters) and feeding them to a Fast-Fourier Transform algorithm, as is known in the art. The ten most significant component frequencies are output as signal features 200.

Statistical model 208 is a group of statistical routines that extract common descriptive statistics associated with the data signal. Such parameters are known in the art and can include the minimum value of the signal, the maximum value of the signal, the mean, harmonic mean, geometric mean, root mean square value of the signal, the crest factor, the absolute deviation, the standard deviation, the skew, the kurtosis, the regression r-square value, and the time of the maximum value of the signal. Each of these calculated results is output as part of signal features 200.

Through the application of each of the above models to the signal data and DAQ parameters, signal features 200 are produced. Signal features 200, as described above, are a set of parameters that collectively describe the signal without the need for reproducing the entirety of the signal. Signal features 200 are used in the decision module 128 as described below, and may also be stored directly in storage database 122. In addition to the models applied above, analysis module 126 may also optionally perform compression of the signal, for example by using a discrete cosine transform, to store the signal data itself for storage along with the signal features.

Once analysis module 126 has calculated signal feature 200, the features are passed to decision module 128 for determination of a final decision of whether or not a spark has occurred and or whether or not a collector flashover is likely to occur in the near future. The defect decision is determined using signal features 200 and the DAQ parameters.

In one embodiment, frequency determined by ADVFREQ model 204 is compared to the four most significant component frequencies determined by FFT model 206. If the frequency is not within 1% of one of the top four most significant component frequencies, then the signal is flagged as a noise signal and a decision that the signal is noise is output.

If the frequency from ADVFREQ model 204 is within 1% of one of the four most significant component frequencies, then a determination as to whether the signal can be qualified as a possible discharge (e.g., a sparking event) is made. The decision of whether or not a sparking event occurred is generally based on pairs of signal features. In one embodiment, this decision is based upon two values, the Weibull shape parameter, and the ratio of the amplitude from ADVFREQ model 204 to the Weibull scale parameter (referred to as ADVFREQFEATURE). If the Weibull shape is between a pair of predetermined limits or bounds, and the ADVFREQFEATURE is between a separate pair of predetermined bounds, then the signal from that sensor is considered to represent a discharge. The bounds are determined experimentally during the setup of the system as described below. This analysis is performed separately for the data associated with each sensor. In other embodiments, other signal feature pairs are used for identifying the occurrence of a sparking event.

When a sparking event has been detected, decision module 128 generates an indication that the spark event has occurred. The indication may include, for example, generating an alert to inform an operator that a spark event has occurred, such as via reporting system 124, or storing an indication that the spark event has occurred and/or signal data corresponding to the sparking event to database 122. Moreover, decision module 128 determines whether or not the occurrence of the sparking event is indicative of a likely collector flashover occurring soon. The determination may be based on one or more of signal features 200 and/or may be based on data relating to multiple sparking events. For example, decision module 128 stores an indication that a spark event has occurred for each spark event that it detects over time. In some embodiments, when a threshold number of spark events have been detected over a certain period of time, decision module 128 determines that a collector flashover is likely to occur soon. Additionally, or alternatively, decision module 128 may monitor the frequency of sparking events and determine that a collector flashover is likely to occur soon based on the frequency of sparking events exceeding a threshold. In other embodiments, the likelihood of a collector flashover may be determined based on one or more of signal features 200. When one or more signal feature 200, or signal feature pair, accompanying a discharge event exceeds a threshold, decision module 128 may determine that a collector flashover is likely to occur soon. However the likelihood of a collector flashover is determined, in exemplary system 100, decision module 128 generates an alert (sometimes referred to herein as a flashover alert) that a collector flashover is likely to occur when it has determined that a collector flashover is likely to occur. The alert may be a humanly cognizable alert, such as a flashing light, a message displayed on a display device, etc., and/or may be a transmission to another system, such as a remote monitoring and diagnosis system.

Figure 3:
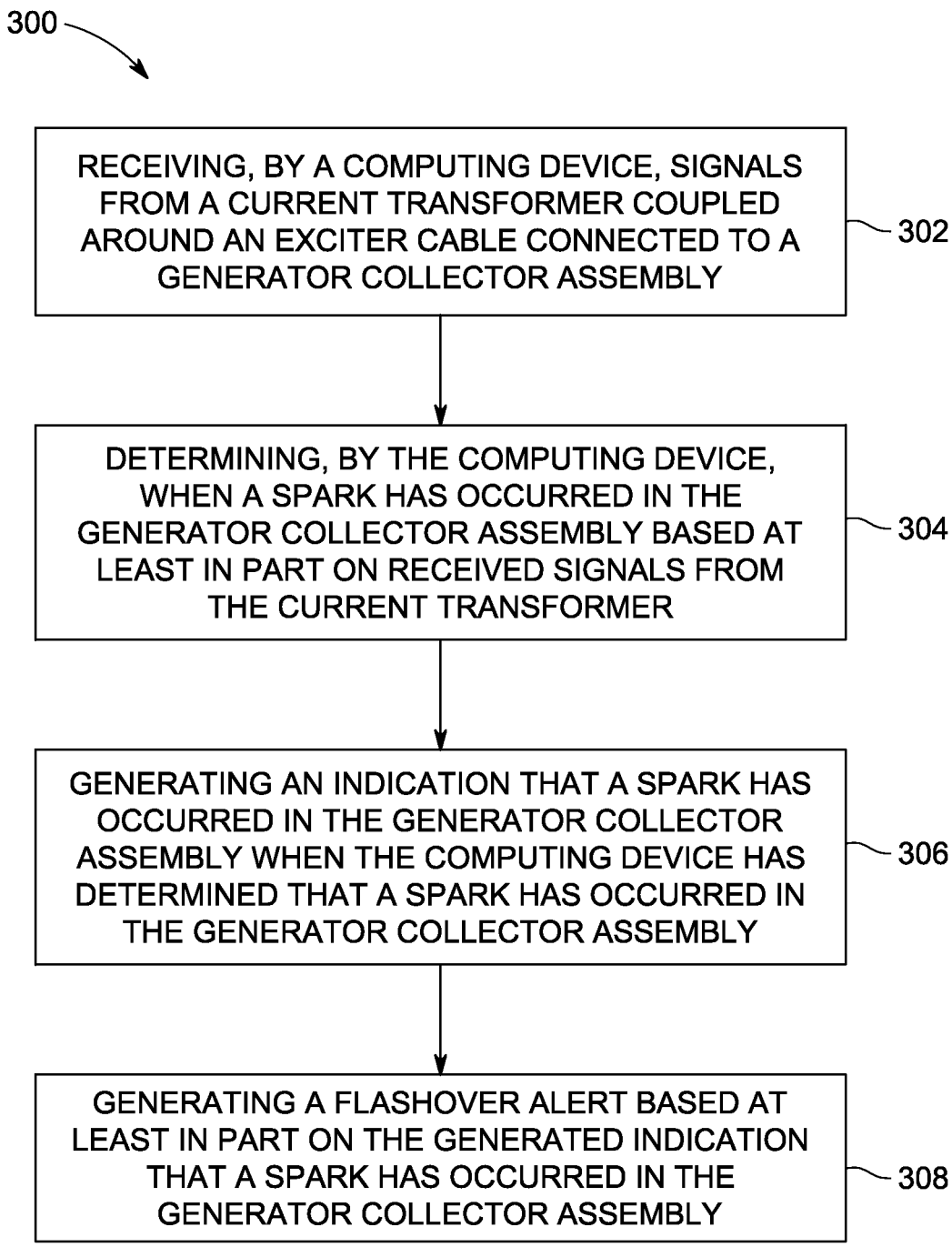
FIG. 3 is a flow diagram of an exemplary method for passively monitoring a generator collector assembly.

FIG. 3 is a flow diagram of a method 300 for passively monitoring a generator, such as generator 100. Method 300 may be performed by any suitable system including, for example, system 100. Method 300 includes receiving 302 signals from a current transformer coupled around an exciter cable connected to a generator collector assembly. The signals are received by a computing device, such as computing device 117. The computing device determines 304 when a spark has occurred in the generator collector assembly based at least in part on received signals from the current transformer. An indication is generated 306 that a spark has occurred in the generator collector assembly when a computing device has determined that a spark has occurred in the generator collector assembly. A flashover alert is generated 308 based at least in part on the generated indication that a spark has occurred in the generator collector assembly As discussed above, the bounds/thresholds of the signal and/or signal features are determined through an experimental process of running system 100 in an environment where the presence of defects can be confirmed independently. During the experimental runs, the signal features are captured for all events. The bounding values for the signal feature pairs, such as ADVFREQFEATURE, are then calculated to provide the appropriate balance between false positives and false negatives.

Figure 4:
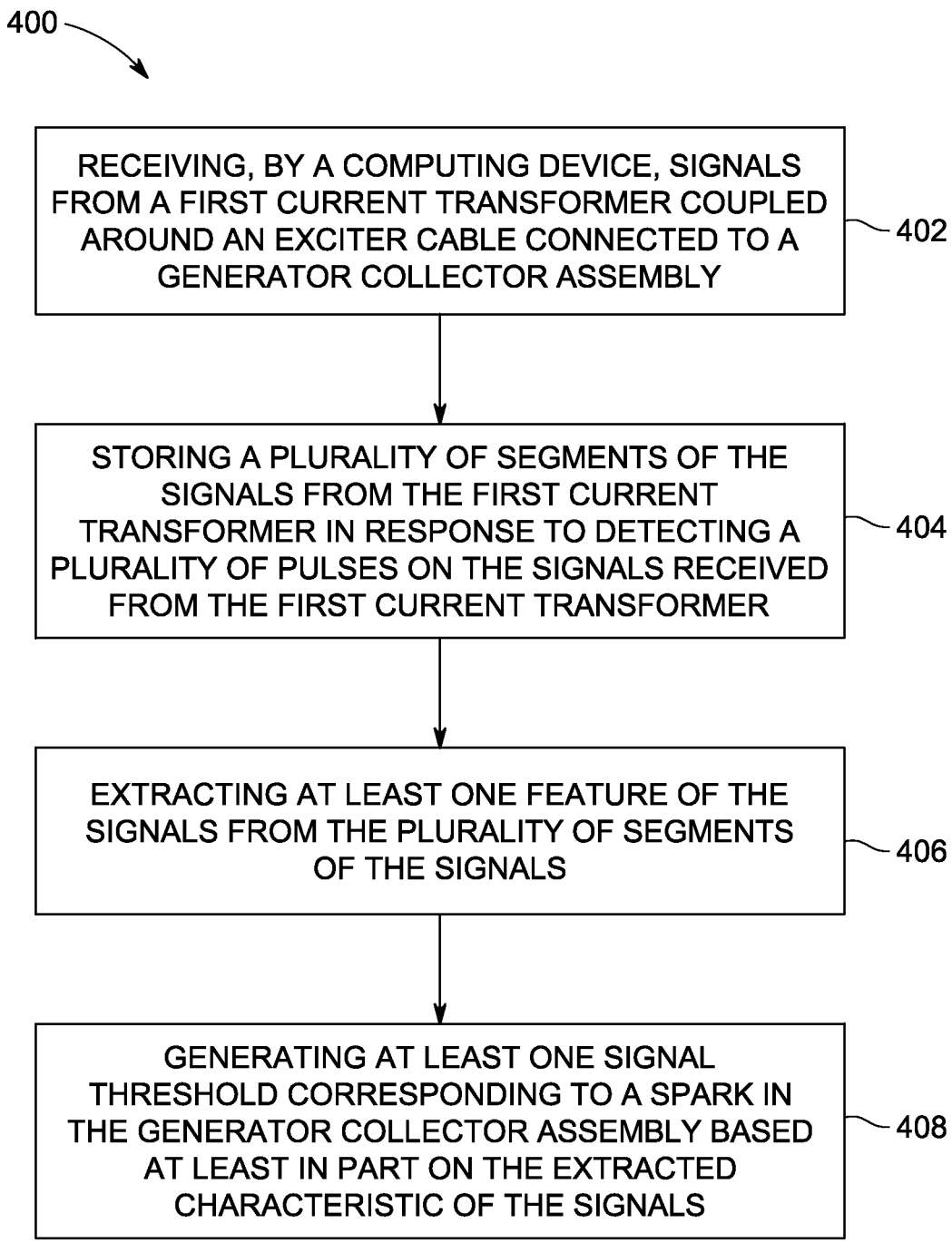
FIG. 4 is a flow diagram of an exemplary method for training a system for passive monitoring of a generator.

FIG. 4 is a flow diagram of an exemplary method 400 for training a system, such as system 100, for passive monitoring of a generator. Method 400 includes receiving 402 signals from a first current transformer coupled around an exciter cable connected to a generator collector assembly. The signals are received by a computing device, such as computing device 117. A plurality of segments of the signals from the first current transformer is stored 404 in response to detecting a plurality of segments of the signals received from the first current transformer. At least one feature of the signals from the plurality of segments of the signals is extracted 406 and at least one signal threshold corresponding to a spark in the generator collector assembly is generated 408 based at least in part on the extracted characteristic of the signals.

More specifically, to train system 100, system 100 is coupled to a generator as shown in FIG. 1. System 100 is set to monitor signals from first sensor 114 for signals that exceed an initial threshold value. When a signal exceeding the initial threshold value is detected, a sequence of data from first and second sensors 114 and 116 is captured and stored. System 100 is permitted to collect such data for a period of time until a sufficient number of samples of data are acquired. In one embodiment, system 100 is operated until 2500 samples have been collected. A signal in this context consists of 2500 samples. For example, system 100 may acquire signal data (2500 samples) for several hours, several days, etc.

After the data is collected, principal component analysis (PCA) is performed on the signal data to identify which features of the signal data are important for the decision making models. More specifically, signal features 200 described above are determined for each data sample, and signal features 200 are analyzed with PCA techniques. The features are projected in factor space. FIG. 5 shows an example projection in factor space of twenty four signal features. If two features are far from the center, and if they are close to each other they are significantly positively correlated.

For example the top four FFT frequencies (frq1-frq4) are significantly positively correlated. If features are orthogonal, they are not correlated. If features are on opposite sides in the plot, then they are significantly negatively correlated. PCA is useful to avoid using only correlated features in the decision algorithm and to reduce the dimensionality. Doing the PCA also helps to get an overview of which features are important and which features convey the same information.

Clusters of features are studied to identify pairs of signal features, which are then analyzed. In the exemplary embodiment, the clustering uses agglomerative hierarchical clustering, which is a bottom-up clustering method where clusters have sub-clusters, which in turn have sub-clusters, etc. Agglomerative hierarchical clustering starts with every single feature-pair object in a single cluster. Then in successive iteration, it agglomerates (merges) the closest pair of clusters by satisfying some similarity criteria, until all of the data is in one cluster. The criteria used in the exemplary embodiment include calculating inner squared distance (minimum variance algorithm) and using Euclidean distances. Cluster centers and numbers of points in each cluster are tracked. This data is used to identify pairs of features that indicate discharge events.

Based on the PCA and cluster analysis, thresholds are established for use by system 100 in detecting sparking events. More specifically, one or more thresholds are set to determine when DAQ 118 should begin collecting data of a possible sparking event. Thresholds may also be set for use by decision module 128 to determine, based on signal features 200, whether a sparking event has occurred. In some embodiments, training of system 100 may be conducted on a generator at different times to more accurately identify signal features indicative of the occurrence of a discharge event. For example, a generator may be monitored before and after routine maintenance. Alternatively, or additionally, a generator may be monitored before and after a major overhaul. By comparing the analysis of the signals collected from the generator before and after such maintenance/overhaul, identification of signal features 200 likely to indicate a need for maintenance and/or a likelihood of collector flashover may be improved.

The various models discussed above may be calculated using a variety of techniques as are known in the art. In one embodiment, the models may be run using programmed routines on a general purpose computer. The routines may be programmed directly, or may make use of analysis packages, such as Matlab. In other embodiments, the appropriate analytic routines may be performed in firmware, or purpose built hardware. In this way, diagnostics engine 120 can be implemented in a mixture of hardware and software as is appropriate to various applications.

In addition, it will be appreciated that the communication of the data between DAQ 118 and diagnostics engine 120, as well as within diagnostics engine's modules 126 and 128, can be carried out in a variety of ways. For example, data could be captured by DAQ 118 and then sent by wired or wireless connection to diagnostics engine 120. Diagnostics engine 120 may then send its results to storage database 122 via wireless or wired communication. Reporting may be done by wired connection or wirelessly to displays located remotely from diagnostics engine 120 itself.

Experimental testing of the systems and techniques described herein have borne out that such passive monitoring systems can be used to monitor generator collector assembly sparking and predict collector flashover. Using the systems and techniques described, a generator can be monitored without the need for periodic disconnecting and without any need to send testing signals. In addition to making use of passive monitoring, the systems and techniques described are suitable for on-board use in real-time, unlike monitoring systems that require disconnection of wires and/or physical inspection. In addition to being able to operate in real-time, being always connected allows for the monitoring system to be able to detect and locate faults before other safety systems, such as arc fault circuit breakers, can react. By detecting such emerging defects and faults prior to failure, overall equipment life can be preserved, and the reliability and readiness of the system can be improved.

The various embodiments of monitoring techniques described above thus provide a way to provide real-time detection of discharge events and advance warning of likely collector flashover. These techniques and systems also allow for on-board detection systems suitable for use in mobile platforms, such as helicopters or aircraft.

It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

Furthermore, the skilled artisan will recognize the interchangeability of various features from different embodiments. For example, the real-time reporting described with respect to one embodiment can be adapted for use with the storage of data for later use during scheduled maintenance. Similarly, the various features described, as well as other known equivalents for each feature, can be mixed and matched by one of ordinary skill in this art to construct additional systems and techniques in accordance with principles of this disclosure.

Although the systems herein have been disclosed in the context of certain preferred embodiments and examples, it will be understood by those skilled in the art that the invention extends beyond the specifically disclosed embodiments to other alternative embodiments and/or uses of the systems and techniques herein and obvious modifications and equivalents thereof. Thus, it is intended that the scope of the invention disclosed should not be limited by the particular disclosed embodiments described above, but should be determined only by a fair reading of the claims that follow.

A technical effect of the systems and methods described herein includes the ability to generate an indication of a spark in a generator collector assembly after receiving signals from a current transformer coupled around an exciter cable connected to the generator collector assembly and determining when a spark has occurred in the generator collector assembly based at least in part on received signals from the current transformer.

Exemplary embodiments of the systems and methods are described above in detail. The systems and methods are not limited to the specific embodiments described herein, but rather, components of the systems and/or steps of the methods may be utilized independently and separately from other components and/or steps described herein. For example, the system may also be used in combination with other apparatus, systems, and methods, and is not limited to practice with only the system as described herein. Rather, the exemplary embodiment can be implemented and utilized in connection with many other applications.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A system for monitoring a generator, said system comprising:
   a first current transformer for placement around a first exciter cable connected to a generator collector assembly;
   a computing device coupled to receive signals from said first current transformer, said computing device programmed to:
     determine when a spark has occurred in the generator collector assembly based at least in part on the received signals from said first current transformer;
     generate an indication that a spark has occurred in the generator collector assembly; and
     generate a flashover alert based at least in part on the indication that a spark has occurred in the generator collector assembly.

2. A system in accordance with claim 1, wherein said computing device is programmed to record a segment of the signals from said first current transformer in response to detecting a signal exceeding a predetermined threshold received from said first current transformer.

3. A system in accordance with claim 1, further comprising a second current transformer for placement around a second exciter cable connected to the generator collector assembly, and wherein said computing device is coupled to receive signals from said second current transformer.

4. A system in accordance with claim 3, wherein said computing device records a segment of the signals from said second current transformer in response to detecting segments of a signal exceeding threshold received from said first current transformer.

5. A system in accordance with claim 1, wherein said computing device is programmed to determine when a spark has occurred based at least in part on determining whether or not a magnitude of the signals from the first current transformer exceed a threshold.

6. A system in accordance with claim 1, wherein said computing device is programmed to store an indication that a spark has occurred.

7. A system in accordance with claim 6, wherein said computing device is programmed to generate the flashover alert after a predetermined number of indications that a spark has occurred have been stored.

8. A system in accordance with claim 6, wherein said computing device is programmed to generate the flashover alert based at least in part on a frequency of the indications that a spark has occurred.

9. A system in accordance with claim 1, wherein said computing device is programmed to analyze at least one feature of the received signals and determine when a spark has occurred based at least in part on the analyzed feature of the signal.

10. A system in accordance with claim 1, wherein said first current transformer is a radio frequency current transformer.

11. A method for passive monitoring of a generator, said method comprising:
    receiving, by a computing device, signals from a current transformer coupled around an exciter cable connected to a generator collector assembly;
    determining, by the computing device, when a spark has occurred in the generator collector assembly based at least in part on received signals from the current transformer;
    generating an indication that a spark has occurred in the generator collector assembly when the computing device has determined that a spark has occurred in the generator collector assembly; and
    generating a flashover alert based at least in part on the generated indication that a spark has occurred in the generator collector assembly.

12. A method in accordance with claim 11, further comprising storing a segment of signals from the current transformer in response to detecting a signal exceeding a predetermined threshold received from the current transformer.

13. A method in accordance with claim 11, wherein determining when a spark has occurred comprises determining when a spark has occurred based at least in part on determining if the signals have exceeded a predetermined threshold.

14. A method in accordance with claim 11, wherein generating an indication that a spark has occurred comprises generating an alert that a spark has occurred based on at least one of a number of sparks that have occurred, a frequency of sparks that have occurred, and one or more features of the signals associated with occurrence of a spark.

15. A method in accordance with claim 11, further comprising analyzing at least one feature of the received signals, and wherein determining when a spark has occurred is based at least in part on the analyzed feature.

16. A method of training a system for passive monitoring of a generator, said method comprising:
    receiving, by a computing device, signals from a first current transformer coupled around an exciter cable connected to a generator collector assembly;
    storing a plurality of segments of the signals from the first current transformer in response to detecting a plurality of segments of the signals received from the first current transformer, each segment of the plurality of segments of the signals associated with a detected segment of the plurality of segments on the signals received from the first current transformer;
    extracting at least one feature of the signals from the plurality of segments of the signals; and
    generating at least one signal threshold corresponding to a spark in the generator collector assembly based at least in part on the extracted characteristic of the signals.

17. A method in accordance with claim 16, wherein extracting at least one feature of the signals comprises extracting a plurality of features of the signals.

18. A method in accordance with claim 17, further comprising analyzing the plurality of features to identify at least one feature associated with sparking in the generator collector assembly.

19. A method in accordance with claim 18, wherein analyzing the plurality of features comprises principal component analysis.

20. A method in accordance with claim 16, further comprising receiving signals from a second current transformer coupled around an exciter cable connected to the generator collector assembly, storing a plurality of segments of the signals from the second current transformer in response to detecting a plurality of segments on the signals received from the first current transformer, and wherein extracting at least one feature of the signals comprises extracting at least one feature of the signals received from the second current transformer.

* * * * *